United States Patent [19]
Yamada et al.

[11] Patent Number: 5,991,849
[45] Date of Patent: Nov. 23, 1999

[54] REWRITING PROTECTION OF A SIZE VARYING FIRST REGION OF A REPROGRAMMABLE NON-VOLATILE MEMORY

[75] Inventors: Susumu Yamada; Toru Watanabe; Susumu Kubota; Noriyuki Ogata; Masanori Okubayashi, all of Moriguchi, Japan

[73] Assignee: Sanyo Electric Co., Ltd, Osaka, Japan

[21] Appl. No.: 08/833,295

[22] Filed: Apr. 8, 1997

[30] Foreign Application Priority Data

Apr. 10, 1996 [JP] Japan .................................. 8-088401
Apr. 24, 1996 [JP] Japan .................................. 8-102535

[51] Int. Cl.⁶ .............................. G06F 12/00; G11C 7/00
[52] U.S. Cl. ........................ 711/103; 711/152; 711/173; 365/185.29; 365/185.33; 365/189.01
[58] Field of Search .................................. 711/103, 173, 711/152; 365/185.29, 185.33, 154, 189.01

[56] References Cited

U.S. PATENT DOCUMENTS

| | | | |
|---|---|---|---|
| 4,502,115 | 2/1985 | Eguchi | 395/307 |
| 5,093,909 | 3/1992 | Saito | 711/161 |
| 5,097,445 | 3/1992 | Yamauchi | 365/195 |
| 5,408,672 | 4/1995 | Miyazawa et al. | 395/800.37 |
| 5,566,309 | 10/1996 | Tamura | 711/5 |
| 5,592,641 | 1/1997 | Fandrich et al. | 711/103 |
| 5,657,467 | 8/1997 | Hasegawa | 711/103 |
| 5,678,082 | 10/1997 | Miyazawa et al. | 396/300 |
| 5,845,332 | 12/1998 | Inoue et al. | 711/163 |

*Primary Examiner*—Tuan V. Thai
*Attorney, Agent, or Firm*—Loeb & Loeb, LLP

[57] ABSTRACT

A program for rewriting data in an address region B is written in an address region A which can be rewritten by an external PROM writer. After resetting the microcomputer and rewriting the program in address region A, the reset state is cancelled and the last address in address region A of the EEPROM (1) is then stored in a register (17). An address detector (18) prohibits rewriting in address region A based on an address value stored in the register (17).

2 Claims, 2 Drawing Sheets

REWRITING PROTECTION OF A SIZE VARYING FIRST REGION OF A REPROGRAMMABLE NON-VOLATILE MEMORY

BACKGROUND OF THE INVENTION

1. Field of the Invention

The present invention relates to a microcomputer containing a flash memory (EEPROM).

2. Description of the Related Art

A 1-chip microcomputer comprises a program memory (non-volatile memory) integrated over a single chip. A mask ROM, EPROM, EEPROM or such like is used as the program memory.

(1) Mask ROM

This has the advantages that production can be increased and chip area can be reduced by manufacturing a plurality of masks in one batch. However, there is the disadvantage that a plurality of masks have to be re-manufactured in order to perform reprogramming, requiring considerable manufacturing time and making it impossible to perform reprogramming quickly.

(2) EPROM

An EPROM has the advantage that quick reprogramming is possible by ultra-violetly erasing present data and writing new data. However, it has the disadvantage that since all present data are ultra-violetly erased, those data which have been erased unnecessarily must be rewritten.

(3) EEPROM

An EEPROM has the advantage that quick reprogramming is possible by electrically erasing present data and writing new data. In addition, since present data can be partially erased, data which do not need to be erased can be retained.

Recent 1-chip microcomputers mostly tend to contain an EEPROM thereby utilizing the advantages of all the above non-volatile memories. The EEPROM is used as a program memory to control the operation of the 1-chip microcomputer.

Here, the address regions of the EEPROM are deemed to consist of a first address region treated similarly to a mask ROM in which data are not rewritten and a second address region in which data are rewritten as necessary.

Data which have already been written in the EEPROM can be electrically erased. However, since the first address region is treated similarly to a mask ROM, mistaken operations such as the erasure of data in the first address region when the 1-chip microcomputer is operated must be prohibited.

However, there has been the problem that when the 1-chip microcomputer is connected to an external device and address data are supplied from the external device to the first address region of the EEPROM contained in the 1-chip microcomputer, the first address region program of the EEPROM is partially altered causing the 1-chip microcomputer to perform mistaken operations.

Furthermore, depending on the type of external device used, there are cases in which the 1-chip microcomputer cannot be applied unless the first address region of the EEPROM is enlarged. This has led to the problem that the application range of the 1-chip microcomputer is limited.

When an external device not envisaged beforehand is to be additionally connected to the 1-chip microcomputer, a program must be written for enlarging the first address region to enable an external device to be connected and for writing a program for the external device to be added in the second address region. This additional program writes an operation program for operations using the external device in the second address region.

SUMMARY OF THE INVENTION

It is therefore the object of the present invention to provide a microcomputer capable of enabling a rewrite prohibited region to be set in a non-volatile memory.

It is also the object of the present invention to provide a microcomputer capable of preventing mistaken rewriting in a non-volatile memory when no rewrite prohibited region has been set in the non-volatile memory.

According to the present invention, a microcomputer has a non-volatile memory capable of repeatedly writing and reading data and also capable of electrically erasing data which have been written. This non-volatile memory comprises first and second regions, wherein a program for rewriting data stored in the second region is stored in the first region. The microcomputer prohibits rewriting in the first region and varies the size thereof, thereby enabling an external PROM writer or the like to freely rewrite a program stored in the first region.

According to the present invention, when a microcomputer is connected to an external device and an address in a first region of a non-volatile memory contained in the microcomputer has been specified by the external device, it is possible to prevent data in the first region of the non-volatile memory from being rewritten.

Furthermore, the size of the first region of the non-volatile memory contained in the microcomputer can be altered in accordance with the type of external device used as the interface and the supply range of the microcomputer can be extended, thereby increasing the general versatility of the microcomputer.

Furthermore, the microcomputer may acceptably have a register for storing data relating to the range of the first region and a memory controller for controlling the prohibition of rewriting in the non-volatile memory in compliance with the contents of this register. Mistaken rewriting in the first region following a change in the size of the first region can thereby be prevented.

Rewriting of data in a non-volatile memory is normally carried out when the microcomputer is in a state such as reset or hold by directly accessing the non-volatile memory using an external PROM writer or the like. In addition, a write signal is generated when the reset state or such like of the microcomputer has been cancelled. The prohibition of rewriting in the first region can be controlled using this write signal by storing the last address or such like of the first region in the register. Furthermore, by providing a flip-flop which is set by a reset signal and reset by the write signal, based on the state of this flip-flop it is possible to determine whether or not the contents of the register have been set. Mistaken rewriting in the first region of the non-volatile memory when data have not been set in the register can therefore be prevented by prohibiting rewriting in the whole of the non-volatile memory.

In particular, according to the present invention, after the reset state of the microcomputer has been cancelled, rewriting of data in a non-volatile memory can be prohibited even when data indicating the boundary between a first region and a second region of the non-volatile memory have not been set for some reason.

DESCRIPTION OF THE PREFERRED EMBODIMENT

The present invention will next be explained in detail based on the diagrams.

Figure 1:
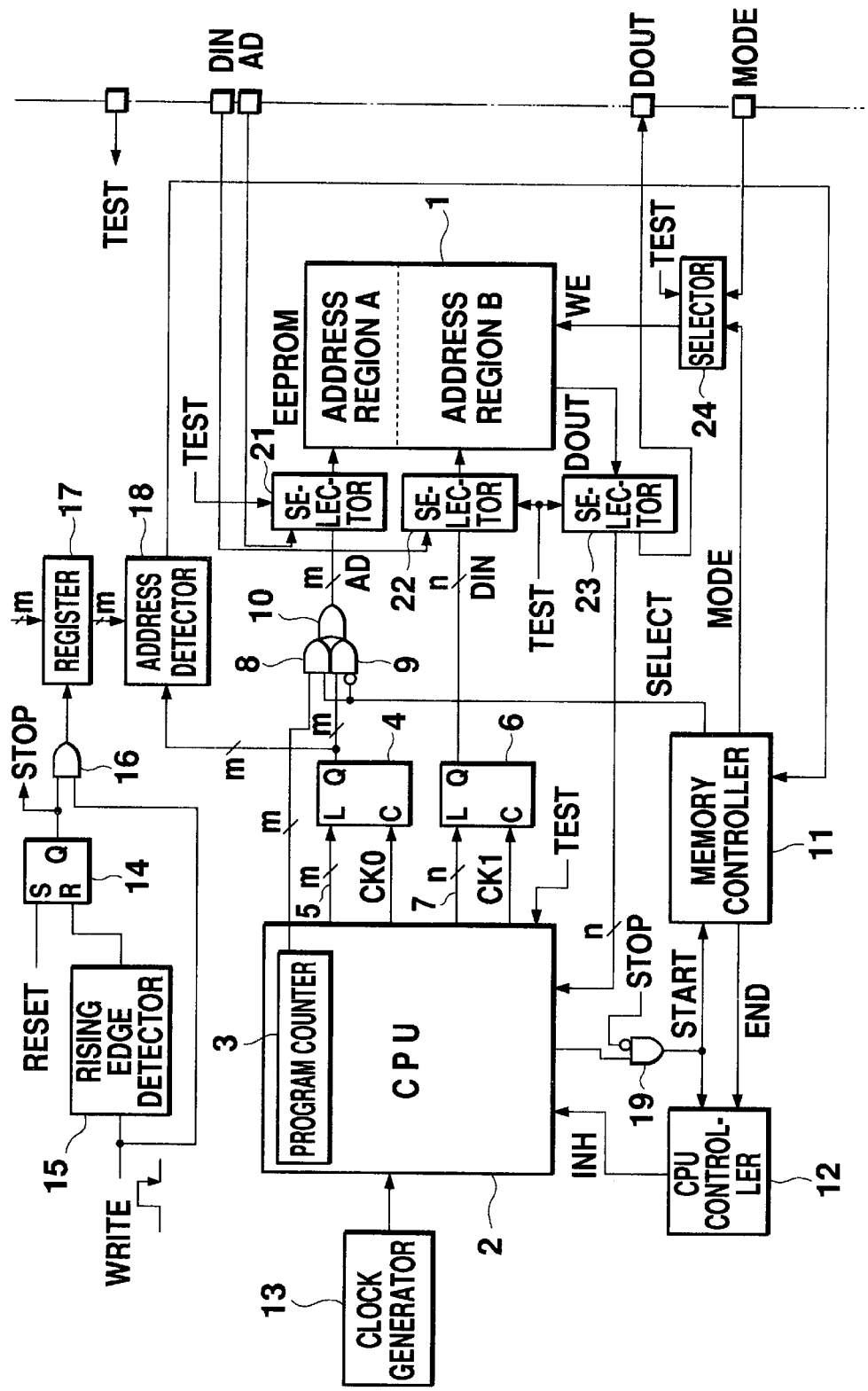
FIG. 1 is a circuit block diagram showing a microcomputer of the present invention.
Figure 2:
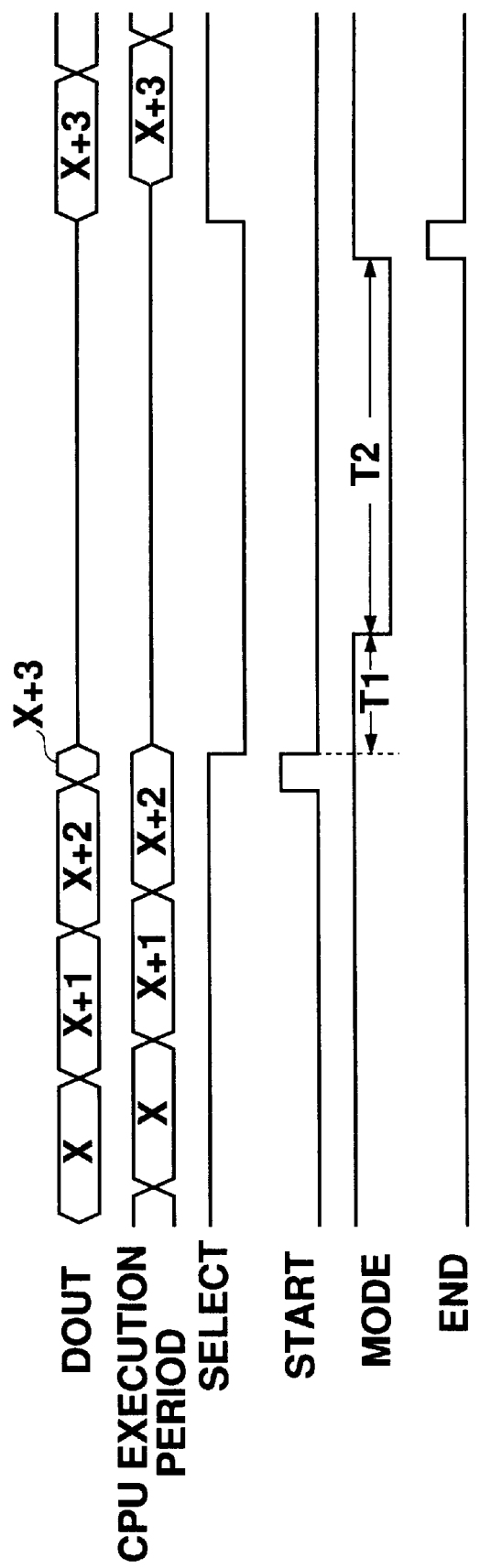
FIG. 2 is a timing chart showing the operation of the microcomputer in FIG. 1.

FIG. 1 is a circuit block diagram showing a microcomputer of the present invention which is integrated above 1 chip. FIG. 2 is a timing chart to explain the operation of FIG. 1.

In FIG. 1, (1) is an EEPROM. This EEPROM (1) is a non-volatile memory capable of repeatedly reading out and writing in data and also of electrically erasing data which have already been written. A region A within the EEPROM (1) is allocated to contain a program for rewriting data in the remaining region B, which is allocated to store data to be used for operation control programs and the like of the 1-chip microcomputer. The EEPROM (1) has a terminal AD to which address data are applied, a terminal DIN to which write data are applied, a terminal DOUT from which read data are outputted and a terminal WE to which a write mode setting signal is applied. A program in region A of the EEPROM (1) can easily be altered by supplying data from an external PROM writer (not shown in the diagram) to the EEPROM (1) and program changes can thus be dealt with swiftly.

(2) is a CPU which operates in compliance with data read out from the terminal DOUT of the EEPROM (1). This CPU (2) comprises components necessary for executing logic operations such as a program counter (3), an instruction register, an instruction decoder, an OR logic unit and the like.

(4) is a latch circuit. The number of latches provided is equal to the bit number m of the EEPROM (1) address data. Terminal L of the latch (4) is connected to the address terminal of the CPU (2) via m parallel address buses (5) and terminal C is likewise connected to one clock terminal of the CPU (2). In other words, the latch (4) latches address data in synchronism with the clock CK0, thereby functioning as an address holder.

(6) is a latch circuit. The number of latches provided is equal to the bit number n of 1 bite of the EEPROM (1). Terminal L of the latch (6) is connected to the address terminal of the CPU (2) via n parallel address buses, (7), terminal C is likewise connected to another clock terminal of the CPU (2) and terminal Q is connected to the EEPROM (1) terminal DIN. In other words, the latch (6) latches write data in synchronism with the clock CK1 and supplies these latched data to the EEPROM (1).

AND gates (8) and (9) and OR gate (10) form a switch. The number of switches provided here is equal to the number of latches (4). One of the AND gate (8) input terminals is connected to the output terminal of the program counter (3), one of the AND gate (9) input terminals is connected to the Q terminal of the latch (4) and the output terminal of the OR gate (10) is connected to the terminal AD of the EEPROM (1). In other words, the switch supplies address data to the EEPROM (1) from either the program counter (3) or the latch (4) in accordance with a select signal SELECT (explained below).

(11) is a memory controller. When a program command to commence rewriting of data in address region B is read out from the EEPROM (1), the CPU (2) decodes the program command and outputs a start pulse START. The memory controller (11) detects the rising edge of the start pulse START, outputs a mode control signal MODE which falls to the low level at time T2 only after a period of time T1 has elapsed from the rising edge and supplies this mode control signal MODE to terminal WE of the EEPROM (1). Therefore, the EEPROM (1) is set to write mode only during the period when the mode control signal MODE is at the low level. Period T2 is set to the period of time required by the EEPROM (1) to write data at a specified address. The memory controller (11) detects the rising edge of the mode control signal MODE and outputs an end pulse END. The memory controller (11) outputs a select signal SELECT at the low level only during the period from the rising edge of the start pulse START to the rising edge of the end pulse END. Consequently, the switch cuts off the program counter (3) and supplies the output from the latch (4) to the terminal AD of the EEPROM (1) only during the period when the select signal SELECT is at the low level.

(12) is a CPU controller. The time required by the EEPROM (1) to execute 1 command is sec units, but the data writing time of the EEPROM (1) is m sec units, i.e. it is extremely long. Therefore, during the period T2 during which the EEPROM (1) is set to write mode, it is necessary to prohibit the CPU (2) from being influenced by the undefined output of the EEPROM (1) terminal DOUT and to stop the program counter (3) at its current value. The CPU controller (12) therefore outputs an prohibit signal INH only during the period from the rising edge of the start pulse START to the rising edge of the end pulse END (the period T1+T2). The CPU (2) detects the prohibit signal INH and prohibits operation in compliance therewith.

(13) is a clock generator for supplying a clock CK to the CPU (2). Based on clock CK, the CPU (2) creates a system clock for operating the 1-chip microcomputer.

The operation of FIG. 1 will next be explained based on the timing chart shown in FIG. 2. In the initial state, the mode control signal MODE and select signal SELECT are outputting at the high level and the EEPROM (1) is set to read mode for reading out data from an address specified by the program counter (3). Program command X is a command to latch address data at latch (4), program command X+1 is a command to latch write data at a latch (6) and program command X+2 is a command to write data to the EEPROM (1).

When program command X is read out from terminal DOUT of the EEPROM (1), the CPU (2) decodes the program command X and the latch (4) latches the address data in synchronism with the clock CK0.

When the program counter (3) is incremented by a designated value and program command X+1 is read out from terminal DOUT of the EEPROM (1), the CPU (2) decodes the program command X+1 and the latch (6) latches the address data in synchronism with the clock CK1.

When the program counter (3) is further incremented by a designated value and program command X+2 is read out from terminal DOUT of the EEPROM (1), the CPU (2) decodes the program command X+2 thereby generating the start pulse START. The select signal SELECT receives the rising edge of the start pulse START and changes to the low level. The mode control signal MODE changes to the low level only at time T1 after a period of time T0 has elapsed since the rising edge of the start pulse START and thereafter returns to the high level. The end pulse END is generated after receiving the return to the high level of the mode control signal MODE. The select signal SELECT receives the rising edge of the end pulse END and changes to high level.

Consequently, the prohibit signal INH is generated during the rewriting of data in address region B of the EEPROM (1) thereby enabling the CPU (2) to ignore the undefined output of the terminal DOUT of the EEPROM (1) and also enabling the program counter (3) to be held at the value corresponding to the generation of the start pulse START. As a result, CPU (2) malfunctions occurring during the rewriting of EEPROM (1) data can be prevented.

In FIG. 1, (14) is an RS flip-flop. A reset signal RESET (high active) for the 1-chip microcomputer is applied to the S terminal of the RS flip-flop (14) and a write pulse signal WRITE (high active) is applied via a rising edge detector (15) to the R terminal. In other words, the RS flip-flop (14) is set when the 1-chip microcomputer is in the reset state and is reset when the write pulse WRITE has risen after the reset state of the 1-chip microcomputer has been cancelled. The output STOP from the Q terminal of the RS flip-flop (14) is applied to one of the input terminals of an AND gate (16) and the write pulse WRITE is applied to the other input terminal. In other words, after the reset state of the 1-chip microcomputer has been cancelled, only 1 write pulse WRITE passes through the AND gate (16) no matter how many times the write pulse WRITE has been generated. (17) is a register in which is stored the last address data in the address region A of the EEPROM (1) in synchronism with the write pulse WRITE outputted from the AND gate (16). In other words, the last address data in the address region A of the EEPROM (1) is set only once in the register (17) by executing a program command after the reset state of the 1-chip microcomputer has been cancelled.

(18) is an address detector for comparing the last address data in the address region A of the EEPROM (1) outputted from the register (17) with the address data outputted from the latch (4) and controlling the memory controller (11) in accordance with the comparison result.

Since address region A of the EEPROM (1) is a program region for rewriting data in address region B, there must be no rewriting of address region A data. When rewriting data in the address region B of the EEPROM (1), there are no adverse conditions within the 1-chip microcomputer which may cause address region A data to be rewritten. However, when the 1-chip microcomputer is connected to an external device and address data in address region A of the EEPROM (1) have been supplied to the 1-chip microcomputer from the external device and latched by the latch (4), there is a danger that the address region A program may be rewritten. Therefore, the address detector (18) detects that the address data outputted from the latch (4) belong to address region A of the EEPROM (1), keeps the mode control signal MODE at the high level and prohibits the EEPROM (1) from switching to write mode. This eliminates any adverse conditions which might cause data in address region A to be rewritten.

Furthermore, since it is possible to set a given address in the register (17), the region in which rewriting has been prohibited (i.e. address region A) can be enlarged or reduced. For instance, when the external device is a personal computer operating in compliance with a program in the address region B of the EEPROM (1), the address region A of the EEPROM (1) must be enlarged because the personal computer performs complex and multiple operations. The size of the address region A of the EEPROM (1) can be varied depending on the type of device used in the interface, thereby increasing the versatility and range of application of the microcomputer.

Here, rewriting of data in the address region A of the EEPROM (1) is carried out after connecting the microcomputer to an external PROM. The microcomputer is reset by essentially disconnecting the non-volatile memory from the microcomputer and data are written directly to the EEPROM (1) by the PROM writer.

For this purpose, selectors 21, 22, 23 and 24 are provided respectively to the address line ADDRESS, the data input line DIN, the data output line DOUT and the mode supply line MODE of the EEPROM (1). These selectors are connected to the PROM writer by means of pins corresponding to each selector. In addition, the switching of these selectors 21, 22, 23 and 24 is controlled by a test signal TEST supplied by the PROM writer.

In other words, when rewriting data in address region A of the EEPROM (1), a PROM writer is connected to the microcomputer and supplies a test signal TEST of "1". This disconnects the selectors from the microcomputer and the lines from the PROM writer become effective. The test signal TEST is also supplied to the CPU (2). The CPU (2) is resultantly reset and the reset signal RESET changes to "1". This enables the PROM writer to reprogram the EEPROM (1) using the mode signal MODE, to specify an address in address region A and to input data thereto through data input DIN. As a result, the desired data are written in address region A thereby rewriting the address region A data, i.e. rewriting the program for rewriting in address region B stored in the address region A.

When this rewriting operation is completed, the PROM writer changes the test signal TEST to "0". This disconnects the selectors 21, 22, 23 and 24 from the PROM writer, enabling them to be controlled by the microcomputer. In addition, the test signal TEST cancels the reset state of the CPU (2) and the reset signal RESET returns to "0".

The program written in the EEPROM (1) by the PROM writer includes data relating to the last address in the address region A. When a program stored in address region A is executed and data in address region B (data comprising an operation program executed by the CPU (2)) have been written, a program for writing the last address of the address region A in the register (17) is written in the address region B. When the CPU (2) executes the program written in address region B thereby generating the first write pulse WRITE, the final address in address region A is written in the register (17). Thus a write command from the CPU (2) prevents rewriting of data in the address region A. Furthermore, since an AND gate (19) prohibits the start signal START, rewriting of data in the address region A can be prevented even when no write pulse WRITE has been outputted. In such a case, rewriting is prohibited for the whole of the EEPROM (1).

(19) is an AND gate. A start pulse START is applied to one of the terminals of this AND gate (19) and a signal STOP is applied to the reverse side of the other terminal.

Since a write pulse WRITE is generated after the reset state of the 1-chip microcomputer has been cancelled, the signal STOP outputted from the Q terminal of the RS flip-flop (14) has a logic value of "0". The AND gate (19) therefore opens, the CPU (2) supplies the start pulse START to the memory controller (11) and to a CPU controller (12) and data in the EEPROM (1) can be rewritten without problematic conditions arising.

However, if for some reason no write pulse WRITE has been generated, the logic value of the STOP output from the Q terminal of the RS flip-flop (14) remains "0" after the 1-chip microcomputer reset has been cancelled. Therefore, the AND gate (19) closes, thereby stopping the supply of the start pulse START to the memory controller (11) and prohibiting the data rewriting operation of the EEPROM (1). In other words, adverse conditions causing unnecessary rewriting of address data in the EEPROM (1) can be eliminated.

While there has been described what is at present considered to be a preferred embodiment of the invention, it will be understood that various modifications may be made thereto, and it is intended that the appended claims cover all such modifications as fall within the true spirit and scope of the invention.

What is claimed is:

1. A microcomputer comprising:

a non-volatile memory capable of repeatedly writing and reading data and also capable of electrically erasing said data which have been written, wherein the non-volatile memory comprises first and second regions and a program for rewriting data stored in the second region is stored in the first region;

a setting circuit for setting an address data which represents a boundary between the first and second regions of the non-volatile memory;

an address detector for comparing an address setting value which is preset in said setting circuit with a designating address of said non-volatile memory and detecting in which of the first and second regions said designating address of the non-volatile memory exists; and a memory controller for prohibiting a non-volatile memory data rewriting operation when the designating address is in the first region of the non-volatile memory based on a detection result of said address detector;

wherein when a range of said designating address determined by the address detector to be within the first region has not been set by the setting circuit, the memory controller prohibit said non-volatile memory data rewriting operation no matter which address in the non-volatile memory is specified;

wherein the first and second regions are adjacent an address space;

wherein the address detector comprises a register for storing the address setting value indicating boundary of the first and second regions;

wherein the address detector detects that the first region has been specified from a fact that a specified address is further to the first region side than the address setting value indicating the boundary stored in the register;

wherein the setting circuit further comprises a storing circuit for storing a generation of a write pulse generated when a reset state of the microcomputer has been cancelled; and said address setting value indicating the boundary between the first and second regions of the non-volatile memory is set by storing the generation of the write pulse in the storing circuit.

2. A microcomputer according to claim 1, wherein the storing circuit comprises a flip-flop which is set in accordance with a reset signal and reset in accordance with a generation of the write pulse; and when the flip-flop has not been reset, the memory controller prohibits data rewriting no matter which address in the non-volatile memory is specified.

* * * * *